United States Patent [19]
Nii

[11] Patent Number: 5,516,589
[45] Date of Patent: May 14, 1996

[54] SILICON CARBIDE THIN FILM CIRCUIT ELEMENT AND METHOD OF MANUFACTURING THE SAME

[75] Inventor: Keita Nii, Kyoto, Japan

[73] Assignee: Rohm Co., Ltd., Kyoto, Japan

[21] Appl. No.: 266,168

[22] Filed: Jun. 27, 1994

Related U.S. Application Data

[63] Continuation of Ser. No. 876,184, Apr. 30, 1992, abandoned.

[30]     Foreign Application Priority Data

Jul. 19, 1991   [JP]   Japan ................................. 3-179361

[51] Int. Cl.⁶ ........................................................ H01L 27/01
[52] U.S. Cl. ........................ 428/469; 428/446; 428/457; 428/472; 428/697; 428/698; 428/699; 428/701; 428/702
[58] Field of Search ..................................... 428/446, 457, 428/472, 469, 697, 698, 699, 701, 702, 901

[56]            References Cited

U.S. PATENT DOCUMENTS

| | | | |
|---|---|---|---|
| 4,608,326 | 8/1986 | Neukermans et al. | 428/698 |
| 4,767,666 | 8/1988 | Bunshah et al. | 428/698 |
| 4,792,501 | 12/1988 | Allred et al. | 428/698 |
| 4,941,942 | 7/1990 | Bruns et al. | 430/5 |
| 4,980,303 | 12/1990 | Yamauchi | 257/378 |
| 4,990,994 | 2/1991 | Furukawa et al. | 257/77 |
| 4,994,413 | 2/1991 | Eshita | 257/77 |
| 5,162,255 | 11/1992 | Ito et al. | 437/89 |
| 5,170,231 | 12/1992 | Fujii et al. | 257/368 |
| 5,184,199 | 2/1993 | Fujii et al. | 257/76 |

FOREIGN PATENT DOCUMENTS 59-203799   11/1984   Japan .

Primary Examiner—Archene Turner
Attorney, Agent, or Firm—Brumbaugh, Graves, Donohue & Raymond

[57]            ABSTRACT

A silicon carbide thin film circuit element, in which a layer of β-SiC is allowed to grow laterally also on the surface of a P-type Si monocrystal substrate by vapor growth deposition, to form a circuit element is formed on an insulating material layer having a high melting point.

2 Claims, 1 Drawing Sheet

SILICON CARBIDE THIN FILM CIRCUIT ELEMENT AND METHOD OF MANUFACTURING THE SAME

This application is a continuation of application Ser. No. 07/876,184, filed on Apr. 30, 1992 now abandoned.

BACKGROUND OF THE INVENTION

1. Field of the Invention

This invention relates to a thin film circuit element using β-SiC (beta-Silicon Carbide) which is high in heat resistance and operates at ultra high speed, and a method of manufacturing the thin film circuit element.

2. Description of the Prior Art

A technique of growing a β-SiC monocrystal on a silicon substrate by a CVD (Chemical Vapor Deposition) method to form a β-SiC semiconductor element high in heat resistance is well known in the art, as disclosed by Unexamined Japanese Patent Application (Kokai) Sho-59-203799/ (1984).

The above-described β-SiC has excellent characteristics such as high mobility and high saturation electron speed, attracting special interest as a material to form high speed devices. On the other hand, attention has been paid to a thin film SOI (Silicon On Insulating substrate) technique which is effective in suppressing latch-up or soft error and short channel effect, and a lateral epitaxial growth technique is available as its manufacturing method.

Thus, intense interest has been shown towards β-SiC to form an ambient-condition-resisting element, or a high speed element. However, the β-SiC is disadvantageous in that it is insufficient in crystalline characteristic. Therefore, in order to increase the productivity, it is essential to improve the crystalline characteristic.

SUMMARY OF THE INVENTION

In order to solve the above-described problems, according to the invention, β-SiC is allowed also to grow laterally by vapor growth deposition, to form a circuit element on an insulating material layer having a high melting point.

The lateral growth of β-SiC on the high melting point insulating material layer makes it, free from the crystalline characteristic of the under layer of the substrate. As a result, the crystalline characteristic of the β-SiC is improved and the productivity is increased. Furthermore, employment of a thin film SOI structure suppresses the latch-up, soft error and short channel effect, thus permitting a high speed operation of the circuit element.

DESCRIPTION OF PREFERRED EMBODIMENT

One example of a film circuit element according to this invention will be described in combination with its manufacturing method with reference to FIG. 1. FIGS, 1(a) through 1(i) are sectional diagrams showing steps of manufacturing the film circuit element according to the invention.

First, as shown in FIG. 1 (a), a P-type Si monocrystal substrate 1 is thermally oxidized in an oxidation atmosphere at 900° C. for two hours, to form a $SiO_2$ (silicon oxide) film 2 thereon to a thickness of 30 to 100 nm.

Figure 1A:
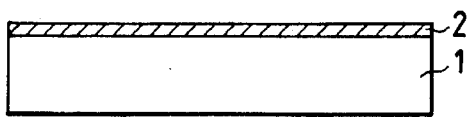
FIGS. 1(a) through 1(i) are sectional diagrams showing steps of manufacturing a thin film circuit element according to this invention.
Figure 1B:
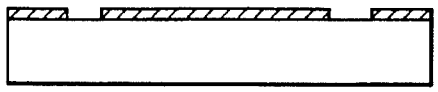

As shown in FIG. 1(b), the $SiO_2$ film 2 is partially removed by HF (hydrogen fluoride), to form a grid-shaped $SiO_2$ pattern.

Figure 1C:
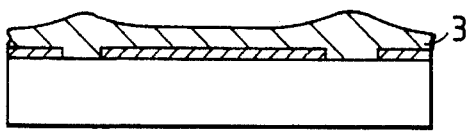

Thereafter, as shown in the FIG. 1(c), an N-type SiC (silicon carbide) film 3 is formed on the Si monocrystal substrate having the above-described $SiO_2$ pattern. In this operation, the SiC film 3 is grown laterally, substantially in parallel with the substrate 1, because of the thickness of the $SiO_2$ film 2 and the pattern; that is, the SiC film 3, spreading over the $SiO_2$ film 2, covers the whole upper surface.

Figure 1D:
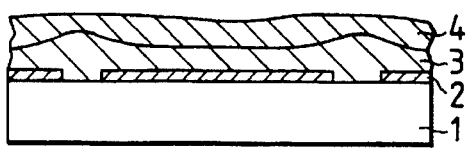
Figure 1E:
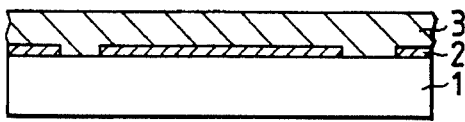

A coating of SOG (Spin On Glass) 4 is formed on the whole surface of the SiC film 3, as shown in FIG. 1(d) Thereafter, as shown in the part (e) of FIG. 1, the SiC film 3 is flattened by etching.

Figure 1F:
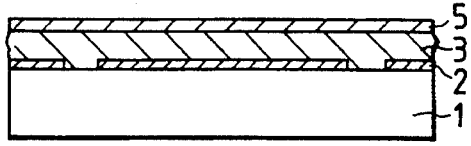

The silicon carbide film 3 thus flattened is thermally oxidized in an oxidation atmosphere at 900° C. for six hours, to form a $SiO_2$ film 5 as shown in FIG. 1(f).

Figure 1G:
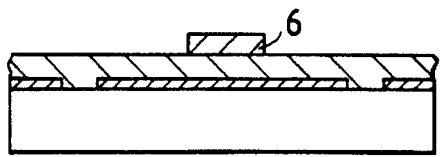

Under this condition, the $SiO_2$ film 5 is partially removed with HF (hydrogen fluoride), to form a gate region 6 for a MOS (Metal Oxide Semiconductor) transistor as shown in FIG. 1(g).

Figure 1H:
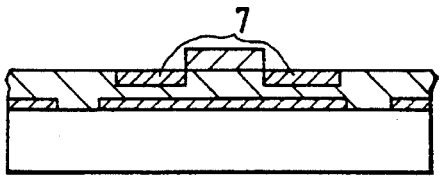

A source region 7 and a drain region 9 are formed for the MOS transistor by ion implantation technique as shown in FIG. 1(h). In this case, the energy of boron $B^+$ is 50 keV, and the dose is $5 \times 10^{15}$ $cm^{-2}$.

Figure 1I:
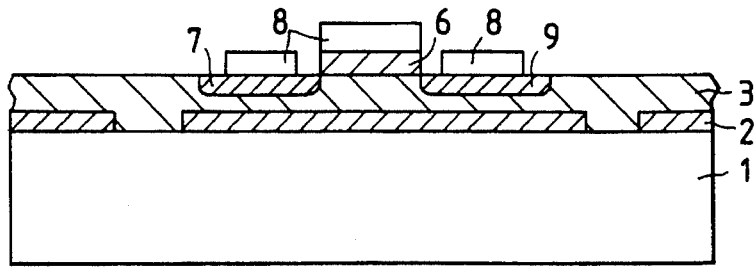

Mo (Molybdenum) 8 is vacuum evaporated on the gate, source and drain regions to form electrodes as shown in the FIG. 1(i).

As was described above, the method of manufacturing a film circuit element according to the invention comprises: a step of patterning a layer of insulating material, which has a high melting point, in the form of a grid on a silicon substrate; a step of forming a β-SiC (beta-silicon carbide) monocrystal film on the silicon substrate and the layer of the insulating material having the high melting point by vapor growth deposition; and a step of forming electrodes and impurity diffusion regions in said β-SiC monocrystal film on the layer of the insulating material having the high melting point. According to the method, a silicon carbide thin film circuit element is manufactured which includes a layer of β-SiC formed laterally on the upper surface of an insulating material layer having high melting point on a silicon substrate. The circuit element may be a transistor, and the high melting point insulating material may be silicon oxide ($SiO_2$) or silicon nitride ($Si_3N_4$).

The thin film circuit element thus formed is increased in productivity by improvement of the crystalline characteristic of the β-SiC. Furthermore, employment of the film SOI (Silicon On Insulating substrate) structure suppresses the latch-up, soft error and short channel effect, thus permitting a high speed operation of the circuit element.

What is claimed is:

1. A silicon carbide thin film circuit element comprising: a silicon substrate; a layer of insulating material having a high melting point in the form of a grid on the silicon substrate; a layer of β-SiC (beta-silicon carbide) formed laterally from a silicon substrate region not covered by the grid on the upper surface of the layer of insulating material and free from the crystalline characteristic of the underlying silicon substrate; an electrode structure formed on the layer of β-SiC; and at least two impurity regions in which an impurity has been implanted in the β-SiC layer located on opposite sides of the electrode structure.

2. A silicon carbide thin film circuit element as claimed in claim 1, wherein said insulating material having the high melting point is selected from a group consisting of silicon oxide ($SiO_2$) and silicon nitride ($Si_3N_4$), and said silicon substrate is a P-type Si monocrystal substrate.

* * * * *